United States Patent
Kim

(10) Patent No.: US 7,348,249 B2
(45) Date of Patent: Mar. 25, 2008

(54) METHOD FOR MANUFACTURING SEMICONDUCTOR DEVICE

(75) Inventor: Jea Hee Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 127 days.

(21) Appl. No.: 11/324,042

(22) Filed: Dec. 29, 2005

(65) Prior Publication Data

US 2006/0148230 A1    Jul. 6, 2006

(30) Foreign Application Priority Data

Dec. 31, 2004   (KR) .................. 10-2004-0117605

(51) Int. Cl.
*H01L 21/336*    (2006.01)
(52) U.S. Cl. .................. 438/301; 438/595; 438/928; 257/21.409
(58) Field of Classification Search ................ 438/301, 438/595, E21.409
See application file for complete search history.

(56) References Cited

U.S. PATENT DOCUMENTS

| | | | | |
|---|---|---|---|---|
| 4,804,455 A | * | 2/1989 | Matson | 204/411 |
| 5,716,873 A | * | 2/1998 | Prall et al. | 438/669 |
| 5,874,325 A | * | 2/1999 | Koike | 438/143 |
| 6,100,150 A | * | 8/2000 | Shih et al. | 438/308 |
| 6,806,178 B2 | * | 10/2004 | Segawa | 438/598 |
| 7,078,773 B2 | * | 7/2006 | Chan et al. | 257/365 |
| 7,129,127 B2 | * | 10/2006 | Chidambaram et al. | 438/231 |
| 2004/0018392 A1 | * | 1/2004 | Yoder | 428/698 |

* cited by examiner

*Primary Examiner*—Michael Lebentritt
*Assistant Examiner*—Angel Roman
(74) *Attorney, Agent, or Firm*—Andrew D. Fortney

(57) ABSTRACT

A method for manufacturing a semiconductor device reduces or prevents copper contamination. The method includes forming a gate electrode on a substrate; forming a first oxide layer on a front surface of the substrate including the gate electrode; depositing a nitride layer (simultaneously) on the first oxide layer and a rear surface of the substrate; depositing a second oxide layer on the nitride layer; removing the second oxide layer from the rear surface of the substrate; and forming spacers at sides of the gate electrode by etching the second oxide layer, the nitride layer, and the first oxide layer.

13 Claims, 3 Drawing Sheets

METHOD FOR MANUFACTURING SEMICONDUCTOR DEVICE

This application claims the benefit of Korean Patent Application No. 10-2004-0117605, filed on Dec. 31, 2004, which is hereby incorporated by reference as if fully set forth herein.

BACKGROUND OF THE INVENTION

1. Field of the Invention

The present invention relates to a semiconductor device, and more particularly, to a method for manufacturing a semiconductor device that reduces or prevents copper contamination.

2. Discussion of the Related Art

Typically in performing a copper-related process such as a copper line formation as part of a back end-of-line process, a rear surface of a substrate can be contaminated with copper. That is, since copper exhibits great diffusivity in certain materials such as single-crystal silicon, copper particles penetrating through the rear surface of the substrate may be diffused to a front surface of the substrate. Various methods for removing the copper from the rear surface of the substrate are proposed.

In manufacturing a contemporary semiconductor device, a layer of silicon nitride is generally deposited on the front surface of the substrate by plasma-enhanced chemical vapor deposition. The layer of silicon nitride may serve as etch stop layer in forming a via-hole from a first line(or first level of metallization) to an underlying, silicon-based device structure (e.g., a gate, source or drain of a transistor). The nitride layer is generally not formed on the rear surface of the substrate. In addition, multi-layer spacers are generally formed in the reverse order of the deposition of the corresponding layers. Thus, since a tetraethylorthosilicate-based oxide layer may be exposed during spacer and/or copper line formation, it can be difficult to prevent the contamination of copper.

SUMMARY OF THE INVENTION

Accordingly, the present invention is directed to a method for manufacturing a semiconductor device that substantially obviates one or more problems due to limitations and disadvantages of the related art.

An object of the present invention is to provide a method for manufacturing a semiconductor device, which prevents copper contamination.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method for manufacturing a semiconductor device, comprising forming a gate electrode on a substrate; forming a first oxide layer on an entire front surface of the substrate including the gate electrode; depositing a front surface nitride layer on the first oxide layer and a rear surface nitride layer on the rear surface of the substrate (e.g., depositing a nitride layer simultaneously on the first oxide layer and a rear surface of the substrate); depositing a second oxide layer on at least the front surface nitride layer; removing any oxide from the rear surface of the substrate; and forming spacers at sides of the gate electrode by etching the second oxide layer, the nitride layer, and the first oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

FIGS. 1A-1G respectively illustrate sequential process steps of a method for manufacturing a semiconductor device according to the present invention.

Figure 1A:
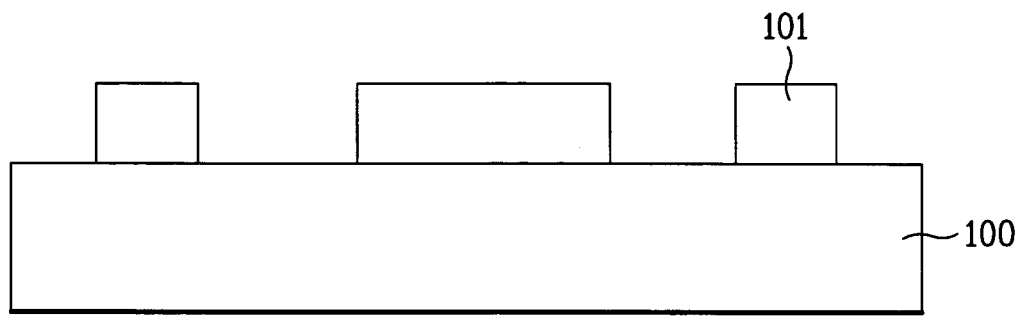
FIGS. 1A-1G are cross-sectional views of a semiconductor device manufactured according to the method of the present invention.

Referring to FIG. 1A, a polysilicon layer is deposited on an entire front surface of a substrate 100 and is then selectively etched (e.g., by photolithographic patterning of a photoresist, and etching the polysilicon layer using the patterned photoresist as an etching mask), thereby forming a gate electrode 101. Generally, although not shown in FIG. 1A, the polysilicon layer is blanket deposited onto substrate 100 having a thin gate oxide layer in the active areas, and both the polysilicon layer and the gate oxide layer are etched to form gate electrode 101. Also, although not shown in FIG. 1A, an insulating layer is deposited on the entire front surface of the substrate 100 including the gate electrode 101. Then, spacers are formed at sides of the gate electrode 101 by etching-back the insulating layer (generally, by an anisotropic and/or dry [plasma] etching technique such as reactive ion etching [RIE]). After that, ions are implanted in the substrate 100 using the spacers and the gate electrode as a mask. Accordingly, source and drain regions are thereby defined in the substrate 100. In this process (but prior to formation of the spacers), lightly doped drain regions (also not shown) may be defined in an area of the substrate overlapping with the source and drain regions by ion implantation (but with a lower dopant dose and at a lower energy than the source/drain implant) using the gate electrode 101 as a mask.

Figure 1B:
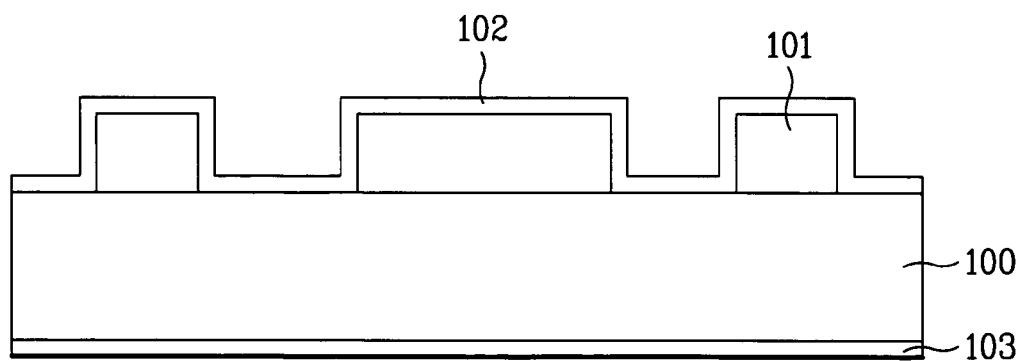

Referring to FIG. 1B, a first oxide layer 102 is deposited on the entire front surface of the substrate 100, including the gate electrode 101. The first oxide layer 102 may comprise a tetraethylorthosilicate (TEOS)-based oxide, blanket deposited by, e.g., plasma-assisted or plasma-enhanced chemical vapor deposition (CVD) from a TEOS precursor. When forming the first oxide layer 102, a first rear surface oxide layer 103 may also be formed on a rear surface (e.g., the entire back surface) of the semiconductor substrate 100. The first rear surface oxide layer 103 generally comprises the same material as the first oxide layer 102.

Figure 1C:
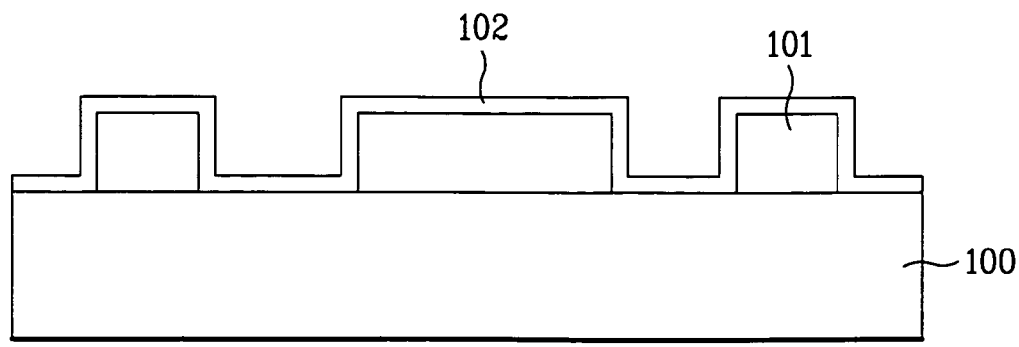

As shown in FIG. 1C, the first rear surface oxide layer 103 is removed from the rear surface of the substrate 100. To remove the first rear surface oxide layer 103, an etching process is performed (e.g., for about six seconds in one embodiment) using a fluorinated ethylene-propylene (FEP) solution, which may further contain HF, $HNO_3$, and $H_2O$. In one embodiment, the etching solution comprises a $HF:HNO_3:H_2O$ mixture in a ratio of 1:6:3, by weight or volume. The HF and $HNO_3$ are typically used in the form of a commercially available, concentrated aqueous solution. The first rear surface oxide layer 103 may be etched at or to a thickness of about 1000 Å. Alternatively, etching the first rear surface oxide layer 103 under the described conditions may be expected to remove about 1000 Å of a typical TEOS-based oxide.

Figure 1D:
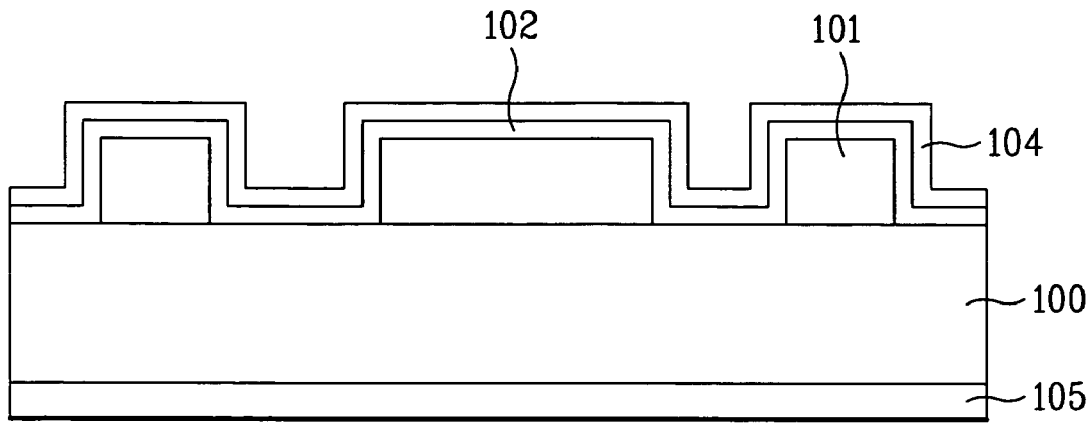

Referring to FIG. 1D, a nitride layer 104 is deposited on the first oxide layer 102, and a rear surface nitride layer 105 is deposited on the rear surface of the substrate. Both the front surface nitride layer 104 and the rear surface nitride layer 105 comprise silicon nitride. In this case, the rear surface nitride layer 105 is formed at a low temperature of about 550° C. or less, generally by low-pressure chemical vapor deposition. In the case where front surface nitride layer 104 and rear surface nitride layer 105 are formed simultaneously, then front surface nitride layer 104 may also be formed at a temperature of about 550° C. or less and/or by low-pressure chemical vapor deposition.

Figure 1E:
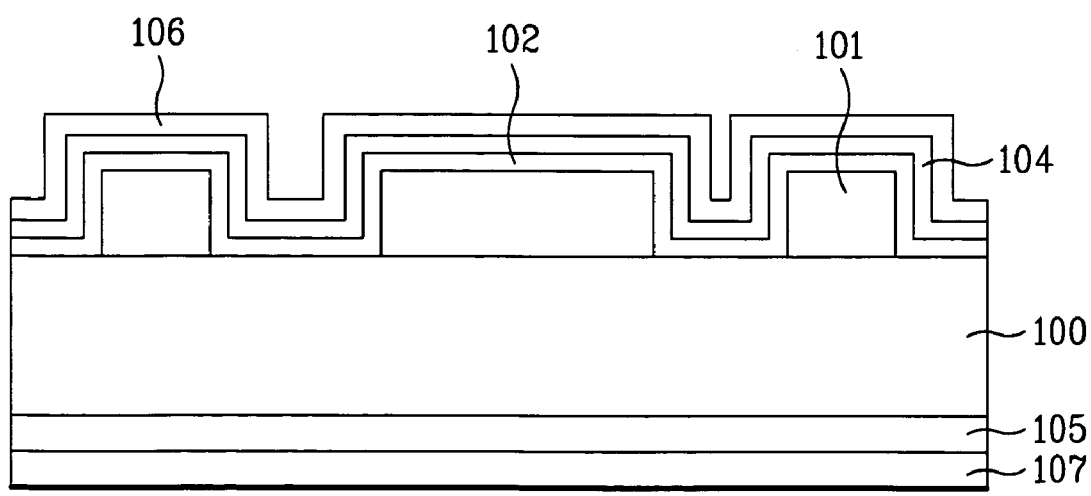

As shown in FIG. 1E, a second oxide layer 106 is deposited on the front surface nitride layer 104. At this time, a second rear surface oxide layer 107 may be formed on the nitride layer 105. The second oxide layer 106 and second rear surface oxide layer 107 may each independently comprise the same material as the first oxide layer 102 and the first rear surface oxide layer 103, and may generally be formed by the same process as the first oxide layer 102 and/or the first rear surface oxide layer 103.

Figure 1F:
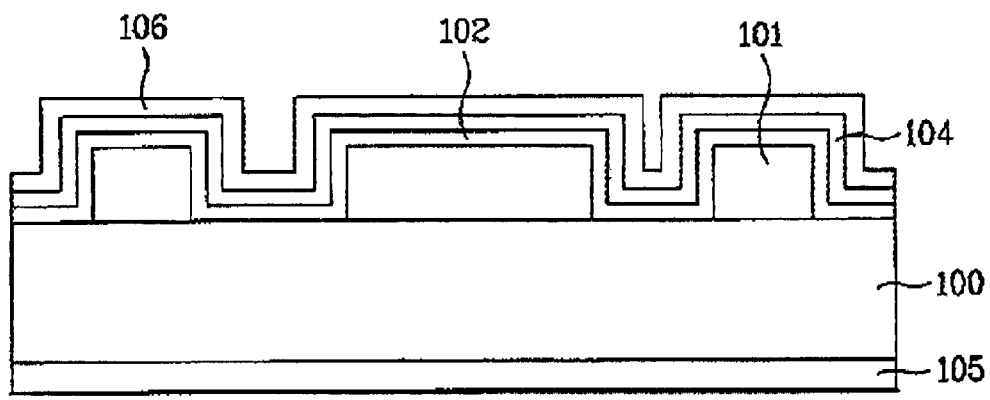

Referring to FIG. 1F, the second rear surface oxide layer 107 is removed from the rear surface of the substrate 100 by another etching process, which is substantially the same as for the first rear surface oxide layer 103 (e.g., in one embodiment, etching may be performed for about six seconds using an FEP solution further containing $HF:HNO_3:H_2O$ in a ratio of about 1:6:3, as above). The second rear surface oxide layer 107 may therefore be etched at or by a thickness of about 1000 Å (e.g., up to about 1000 Å of second rear surface oxide layer 107 may be etched or removed). At this time, the rear surface nitride layer 105 under the second rear surface oxide layer 107 may be slightly etched at or by a thickness of about 10 Å (e.g., up to about 10 Å of second rear surface nitride layer 105 may be etched or removed). As compared with the etched thickness of the second rear surface oxide layer 107, the etched thickness of the second nitride layer 105 is very small and thus exhibits no problems in terms of etching prevention (e.g., functioning as an etch stop layer in the process of etching any overlying oxide) and copper diffusion prevention.

Figure 1G:
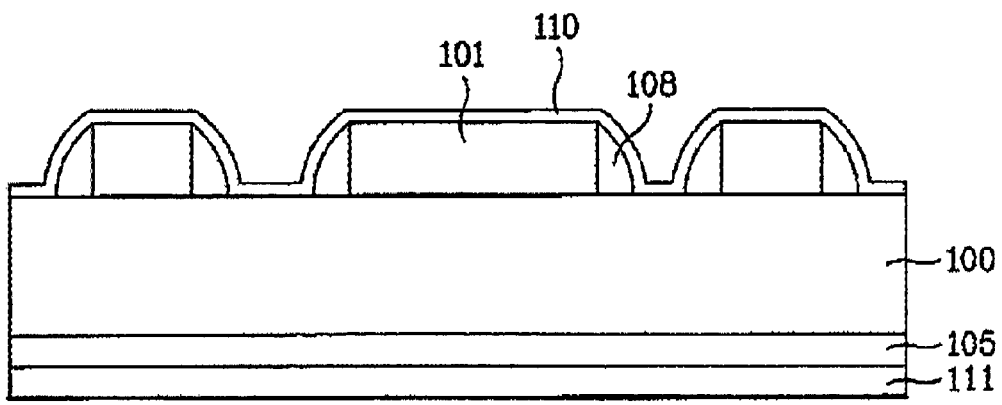

As shown in FIG. 1G, portions of the second oxide layer 106, the nitride layer 104, and the first oxide layer 102 are removed by anisotropic and/or dry (e.g., plasma) etching. As a result, spacers 108 are formed at both sides of the gate electrode 101. The spacers 108 in FIG. 1G are not necessarily drawn to scale, and FIG. 1G does not show the component layers from the second oxide layer 106, the nitride layer 104, and the first oxide layer 102 in the spacers 108. A thin cobalt film 110 is formed on the entire front surface of the substrate 100 including the gate electrode 101 and the spacers 108 (generally, by a physical vapor deposition [PVD] technique such as sputtering). Alternatively, film 110 may comprise titanium, molybdenum, tungsten, nickel or other silicide-forming metal. Thus, following a subsequent heating/annealing step, a silicide layer may be formed on the source and drain regions and the gate electrode 101. In addition, when forming the film 110, a rear surface film 111 may be formed on the nitride layer 105 of the rear surface of the substrate. After forming the silicide layer, the non-reactive film 111 is removed from the rear surface of the substrate 100.

The method for manufacturing the semiconductor device according to the present invention is at least partly due to the property of certain nitride layers (such as silicon nitride) for preventing the copper diffusion (or otherwise acting as a copper diffusion barrier). Also, the nitride layers in the spacers and as the first metal line etch stop layer may further prevent copper contamination of the substrate.

In the method for manufacturing the semiconductor device according to the present invention, when forming the spacers, any oxides or oxide layer(s) are removed from the rear surface of the substrate, but a nitride layer is formed (and retained) on the rear surface of the substrate. As a result, it is possible to reduce or prevent copper contamination of the substrate from the back side or rear surface when forming copper lines, since the nitride layer generally has diffusion barrier and etch stop functions. Also, a semiconductor device according to the present invention exhibits improved reliability, without forming any additional layers, due to the prevention of or reduction in copper contamination.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for manufacturing a semiconductor device, comprising:
   forming a gate electrode on a substrate;
   forming a first oxide layer on an entire front surface of the substrate including the gate electrode;
   depositing a front surface nitride layer on the first oxide layer and a rear surface nitride layer on the rear surface of the substrate;
   depositing a second oxide layer on at least the front surface nitride layer;
   removing any oxide from the rear surface of the substrate by etching with a fluorinated ethylene-propylene (FEP) solution; and
   forming spacers at sides of the gate electrode by etching the second oxide layer, the nitride layer, and the first oxide layer.

2. The method of claim 1, wherein forming the first oxide layer comprises depositing a layer of oxide on front and rear surfaces of the substrate and removing the layer of oxide from the rear surface of the substrate.

3. The method of claim 1, wherein the oxide layer on the rear surface of the substrate is formed when depositing the second oxide layer.

4. The method of claim 1, wherein the first and second oxide layers comprise a tetraethylorthosilicate-based oxide.

5. The method of claim 1, wherein the nitride layer comprises silicon nitride.

6. The method of claim 1, wherein forming the nitride layer comprises low-pressure chemical vapor deposition.

7. The method of claim 6, wherein the low-pressure chemical vapor deposition is performed at a temperature of less than 550° C.

8. The method of claim 1, wherein the FEP solution further comprises a mixture of HF, $HNO_3$, and $H_2O$.

9. The method of claim 1, wherein the FEP solution further comprises a concentrated HF:concentrated $HNO_3$:$H_2O$ mixture having a ratio of about 1:6:3, by weight or volume.

10. The method of claim 8, comprising etching the substrate for about six seconds.

11. The method of claim 1, further comprising:
    implanting impurity ions to the substrate at sides of the gate electrode, after forming the gate electrode.

12. The method of claim 1, wherein the front surface nitride layer and the rear surface nitride layer are deposited simultaneously.

13. The method of claim 1, wherein forming spacers comprises anisotropically etching the second oxide layer, the nitride layer, and the first oxide layer.

* * * * *